(12) United States Patent
Singh et al.

(10) Patent No.: US 6,882,237 B2
(45) Date of Patent: Apr. 19, 2005

(54) CAPTURE RANGE CONTROL MECHANISM FOR VOLTAGE CONTROLLED OSCILLATORS

(75) Inventors: Ranjit Singh, Kanata (CA); Youcef Fouzar, Ottawa (CA); Simon John Skierszkan, Stittsville (CA); Hazem Abdel-Maguid, Ottawa (CA)

(73) Assignee: Zarlink Semiconductor Inc., Kanata (CA)

( * ) Notice: Subject to any disclaimer, the term of this patent is extended or adjusted under 35 U.S.C. 154(b) by 0 days.

(21) Appl. No.: 10/425,795

(22) Filed: Apr. 30, 2003

(65) Prior Publication Data

US 2004/0217820 A1 Nov. 4, 2004

(51) Int. Cl.[7] .............................. H03B 5/00; H03B 5/12; H03B 5/18
(52) U.S. Cl. .................. 331/185; 331/8; 331/36 C; 331/117 R; 331/117 D; 331/177 R; 331/177 V
(58) Field of Search ............................. 331/1 A, 8, 10, 331/17, 18, 25, 36 C, 96, 117 R, 117 FE, 117 D, 175, 177 R, 177 V, 185, 186

(56) References Cited

U.S. PATENT DOCUMENTS

| 3,697,885 | A | * | 10/1972 | Avins et al. .................... 331/8 |
| 5,030,926 | A | * | 7/1991 | Walden ................. 331/116 FE |
| 5,912,595 | A | | 6/1999 | Ma et al. ................. 331/117 D |
| 6,137,372 | A | | 10/2000 | Welland ................. 331/117 R |
| 6,211,745 | B1 | | 4/2001 | Mucke et al. ........... 331/117 R |
| 6,563,392 | B1 | * | 5/2003 | Gomez et al. ......... 331/117 FE |
| 6,670,861 | B1 | | 12/2003 | Balboni |
| 2002/0033739 | A1 | | 3/2002 | Bisanti et al. ............. 331/36 R |
| 2002/0089381 | A1 | | 7/2002 | Mullgrav, Jr. et al. |

* cited by examiner

*Primary Examiner*—David Mis
(74) *Attorney, Agent, or Firm*—Marks & Clerk; Richard J. Mitchell

(57) ABSTRACT

A voltage controlled oscillator generates an output signal whose frequency varies as a first function of a control voltage applied to a control terminal. The voltage controlled oscillator has a wide range of frequency of operation. A gain adjust circuit adjusts the gain of the voltage controlled oscillator such that the first function varies as a second function of the gain. In a preferred embodiment the gain adjust circuit includes a variable impedance that may be external or integrated onto a common chip with the oscillator core.

15 Claims, 4 Drawing Sheets

CAPTURE RANGE CONTROL MECHANISM FOR VOLTAGE CONTROLLED OSCILLATORS

FIELD OF THE INVENTION

This invention relates to electronic voltage controlled oscillator circuits, for example for use in phase locked loops manufactured as monolithic integrated circuits.

BACKGROUND OF THE INVENTION

The frequency of oscillation of an oscillator is typically adjusted with a control voltage. Such an oscillation is referred to as a voltage controlled oscillator (VCO). In some implementations the control voltage varies the current source for one or all of a plurality of inverters connected in series with each other. In other implementations the control voltage varies the capacitance in an inductance/capacitance resonator.

In typical integrated circuit implementations the circuit element which has a capacitance which varies with a control voltage is a collector varactor. This may be a diode employed as a variable capacitor with the variation of junction capacitance dependent on the reverse bias voltage or a MOS varactor in which case the enhancement or depletion region under the gate of a surface field effect transistor varies as a function of the gate to drain/source voltage. The drain or source are typically connected together in such implementations. In both cases the capacitance varies in a non-linear fashion to changes in control voltage. The variation in the frequency of oscillation in turn also varies in a non-linear fashion to changes in the capacitance of the resonator (in fact it typically varies as $1/\sqrt{(LC)}$. The overall result is that the gain of the oscillator, which is defined herein as the ratio of (changes in frequency)/(changes in control voltage), varies with the applied control voltage. In many applications, such as frequency synthesizers for cellular telephones, phase-locked loops for telephony systems, such as SONET optical links, it is desirable to minimize this gain.

A phase locked loop typically comprises a phase detector which measures the phase offset between a reference clock, a charge pump which converts the detected phase difference to a source or sink current that varies in duration commensurate with the duration of the phase difference, a loop filter consisting of some combination of resistors and capacitors which accumulates the charge of the charge pump resulting in a varying voltage. This voltage is either directly fed to the oscillator or passed through a buffering circuit.

A low gain in the VCO is instrumental in optimizing the system characteristics, such as phase noise, output clock jitter, power supply noise immunity or PLL damping factor. If the gain of the VCO is reduced the capture range of the PLL is also reduced for a given range of control voltage. If after manufacture the oscillator has an offset between its desired frequency or frequency range of resonance and of the system (including the VCO and ancillary circuits) the integrated circuit becomes unusable.

The prior art has focused on VCO tuning methods that utilize on-chip solutions. For example, U.S. Pat. No. 6,137,372 to Welland and U.S. patent publication no. 2002/0033739 A1 to Bisanti et al address the problem of tuning the capture range of a voltage controlled oscillator (VCO) by adding or subtracting circuit elements, in both cases capacitance within the VCO itself. These methods allow the construction of a VCO that can be adjusted for manufacturing variation in the VCO, and they can compensate for variation in ambient conditions that the circuit is operating in, such as changes in temperature, but they have the drawback of abruptly changing the oscillation frequency of the oscillator when a capacitor is added or removed. This is inherently acknowledged in U.S. Pat. No. 6,211,745 column 14 line 51, where it states that "When the VCO 500 is used in such a system the method 800 preferably prevents calibration of the VCO during the time slots that voice/data is being received or transmitted", and in U.S. Pat. No. 6,137,373 in column 9 line 49 where it states that "If desired, the discrete control 502 may continue to monitor the output frequency (fout) 102. If too great an error is detected, discrete control 502 may move the switch (SW) 512 back to select initial control node 510 and again modify the digital control word (Bc) 404 based on a desired procedure." This abrupt change in frequency can be detrimental to overall system performance as a difference in frequency between the VCO and the input reference will produce a phase excursion in the output clocks until the PLL has re-synchronized.

In U.S. Pat. No. 5,912,595 the VCO is tuned in frequency with a control voltage that is switched to discrete levels by a D/A (digital-to-analog) converter. The switching is done to compensate for changes in temperature to minimize the variation in the output frequency of the VCO. Because this switching creates discrete voltage levels in the tuning voltage again each switch action will produce a step in the control voltage of the VCO, creating an abrupt change in VCO frequency with the attendant problems.

SUMMARY OF THE INVENTION

According to the present invention there is provided a voltage controlled oscillator having a wide range of frequency of operation generating an output signal whose frequency varies as a first function of a control voltage applied to a control terminal, wherein the voltage controlled oscillator further includes a variable gain circuit for adjusting the gain of the control voltage applied to the voltage controlled oscillator.

In accordance with the principles of the invention, the voltage controlled oscillator (VCO) should be designed for a relatively wide range of frequency of oscillation. This ensures that despite variations in manufacturing process tolerance and device operating conditions a control voltage can be selected at which the VCO provides operation at the desired frequency. One means of doing this is to bias the varactor with a tuning range close to the forward bias region or even into the forward bias region which greatly enhances its capacitance.

Once a large frequency capture range has been achieved by means of a sufficiently high VCO gain, a variable gain circuit can be inserted as a buffer to the VCO control voltage. This buffer can also be used to introduce a DC offset between the varying input control voltage and the VCO control voltage.

The gain between the variation in input voltage variation and the output voltage variation of the buffer is adjusted by means of a resistor. The resistor may be placed off chip to eliminate any dependency on manufacturing tolerances in the fabrication of integrated circuits or it may be an on chip resistor whose value is adjusted as a coarse control in an on-chip implementation that includes a calibration means. An increase in the value of the external resistor extends the tuning range of the oscillator.

The invention also provides a method of extending the range of a voltage controlled oscillator, said voltage controlled oscillator generating an output frequency dependent on a control voltage, comprising providing a variable gain circuit to adjust the gain of the control voltage applied to the voltage controlled oscillator; and adjusting the gain of the gain adjustment circuit to provide the desired operating range for the voltage controlled oscillator.

BRIEF DESCRIPTION OF THE DRAWINGS

The invention will now be described in more detail, by way of example only, with reference to the accompanying drawings, in which.

DESCRIPTION OF THE PREFERRED EMBODIMENTS

Figure 1:
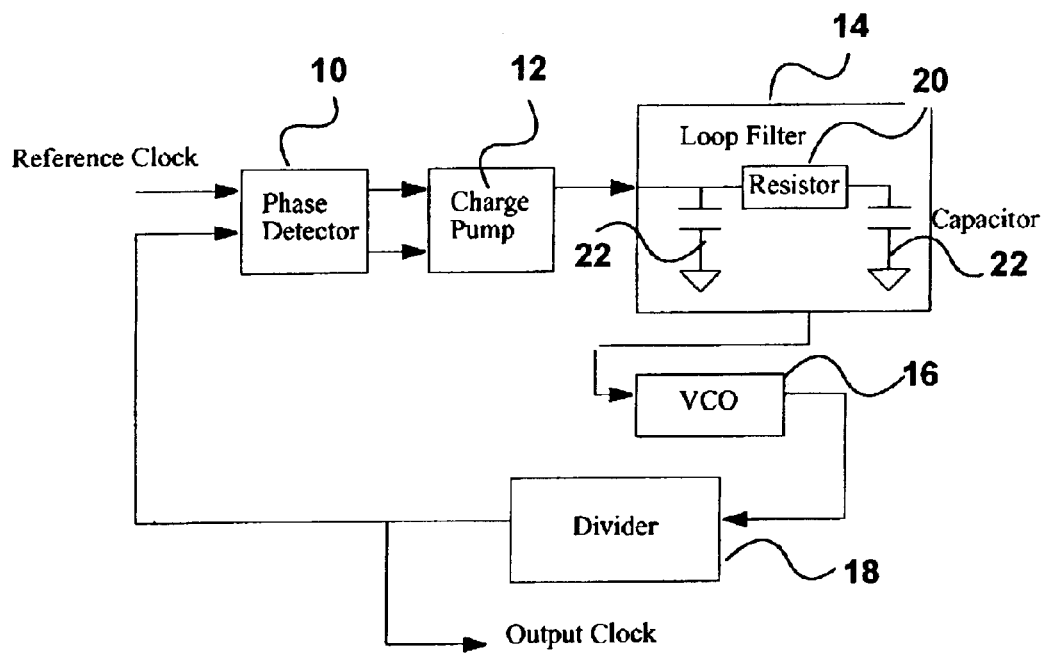
FIG. 1 is a generic block diagram of the elements of a phase lock loop.

FIG. 1 is a block diagram of a generic phase locked loop. It comprises a phase detector 10 receiving at its inputs a reference signal and a feedback signal, a charge pump receiving an output of the phase detector 10 which converts detected phase difference to a source or sink current that varies in duration commensurate with the duration of the phase difference, a voltage controlled oscillator 16 whose output is fed back via divider 18 to the input of the phase detector 10. The loop filter 14 comprises resistor 20 and capacitors 22.

Figure 2:
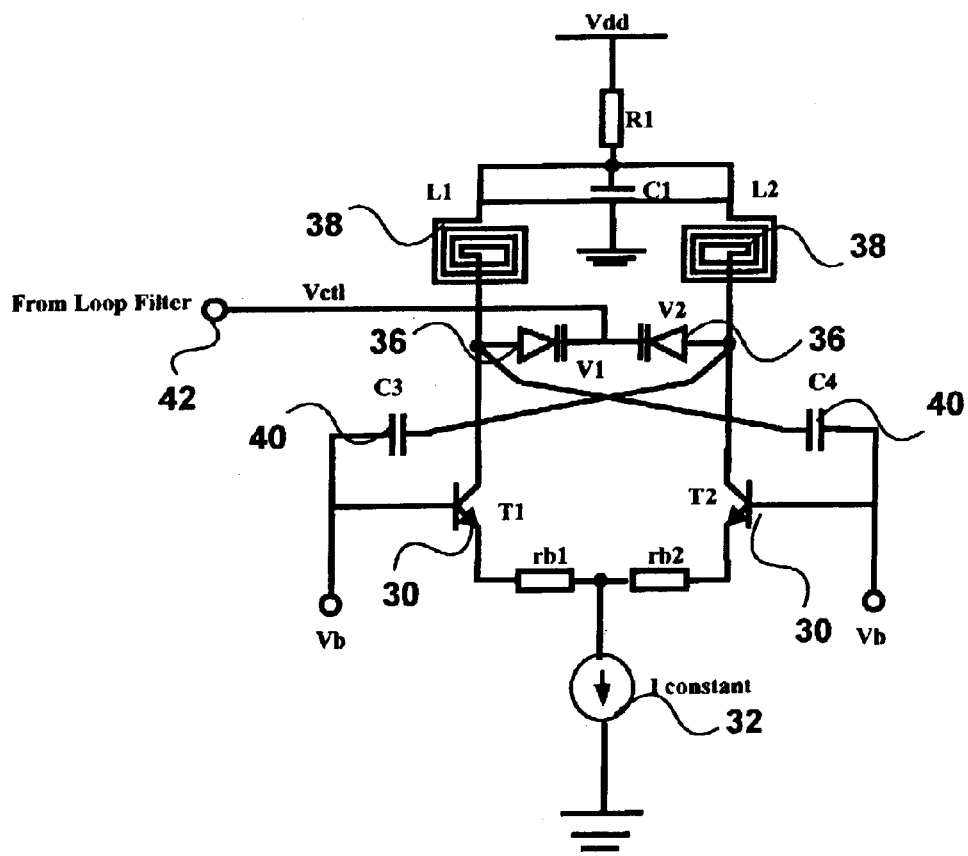
FIG. 2 illustrates an LC voltage controlled oscillator.

The voltage controlled oscillator 16 is shown in FIG. 2. This comprises a pair of transistors 30, a constant current source 32, resistors 34, a pair of varactors 36 (variable capacitance capacitors), a pair of inductors 38, and a pair of capacitors 40. Input terminal 42 receives a control voltage $V_{ctl}$ from the loop filter 14. In operation, the control voltage $V_{ctl}$ varies the capacitance of varactors 36 in the LC circuit, and thus varies the output frequency of the oscillator.

Figure 3:
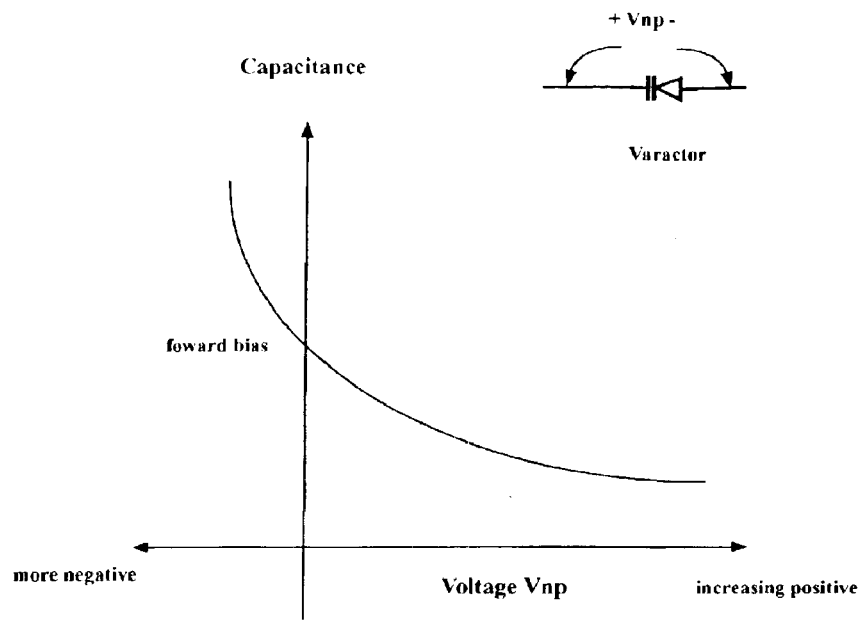
FIG. 3 illustrates the typical variation in capacitance of a varactor as a function of voltage across the diode.

FIG. 3 shows the variation in capacitance of a varactor. It will be noted that the change in capacitance for a given voltage range greatly increases as the forward bias region is approached.

Figure 4:
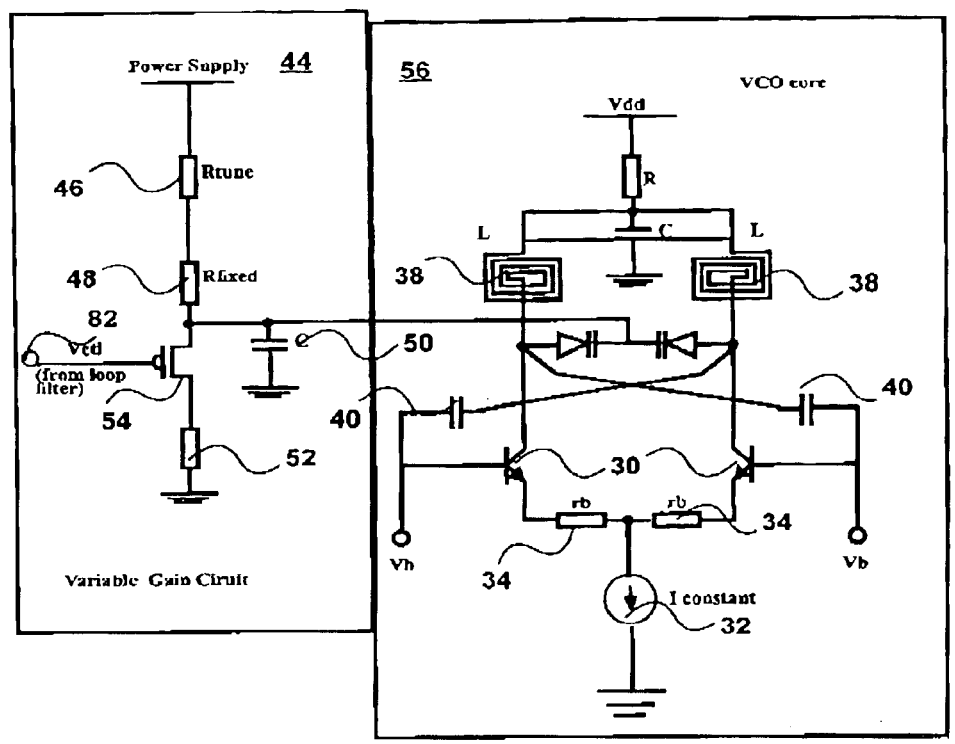
FIG. 4 is a block diagram of a voltage controlled oscillator in accordance with the invention.

In the embodiment of the invention shown in FIG. 4, the core 56 of the VCO 16 is preceded by a variable gain circuit 44 comprising an FET 54, fixed resistors 48, 52, variable resistor element 46, and capacitor 50. The gain of this circuit can be varied by adjusting the variable resistor 46, which lies between gain adjust terminal 82 and the power supply. The variable gain circuit 44 applies an amount of gain to the control voltage $V_{ctl}$ at input terminal 82 that depends on the setting of the variable resistor element 46.

Figure 5A:
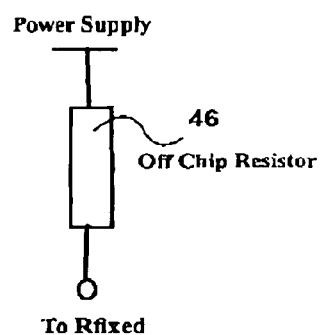
FIGS. 5a, b, c illustrates possible alternative implementations of the resistor Rtune from FIG. 4.

The resistor 46 can be placed off chip to eliminate any dependence on manufacturing tolerances in the fabrication of integrated circuits. Such a resistor is shown in FIG. 5a. In this case, the main portion of the gain adjust circuit is integrated on a monolithic chip with the voltage controlled oscillator core 56. The fixed resistor 48 is connected to a device pad on the chip for connection to the power supply through the external variable resistor 46. Alternatively, the resistor 46 can be an on-chip resistor.

Figure 5B:
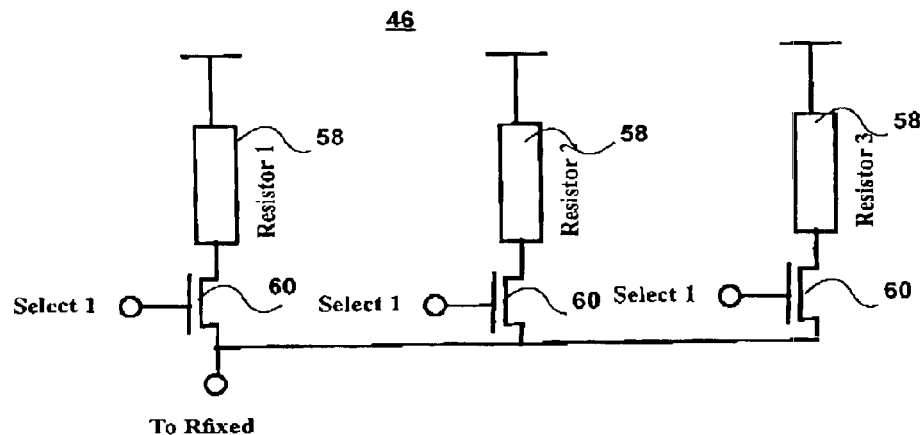
Figure 5C:
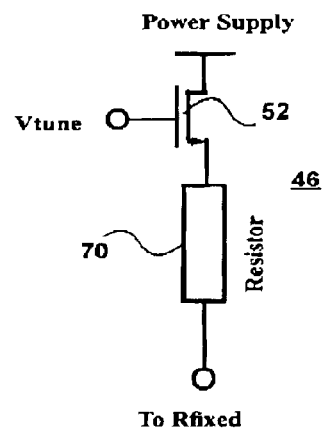

FIGS. 5a to 5c show various possible configurations for the variable resistor element 46. As shown in FIG. 5a, the resistor element can be a simple off-chip variable resistor. Alternatively, as shown in FIG. 5b, it can consist of a circuit comprising several fixed resistors 58 selectable by FET switches 60. In the embodiment shown in FIG. 5c, the variable resistor element consists of fixed resistor 70 in series with a selection MOSFET transistor 62 which controls the current through fixed resistor 70 according to the adjustable voltage Vtune applied to the transistor 62.

The varactor 36 is biased with the tuning range close to the forward bias region or even into the forward bias region as shown in FIG. 3, which greatly enhances its capacitance. Having achieved a large frequency capture range by means of a sufficiently high VCO gain, the variable gain circuit 44 is inserted as a buffer to the VCO control voltage. This buffer can be used to introduce a DC offset between the varying input control voltage and the VCO control voltage.

Figure 6:
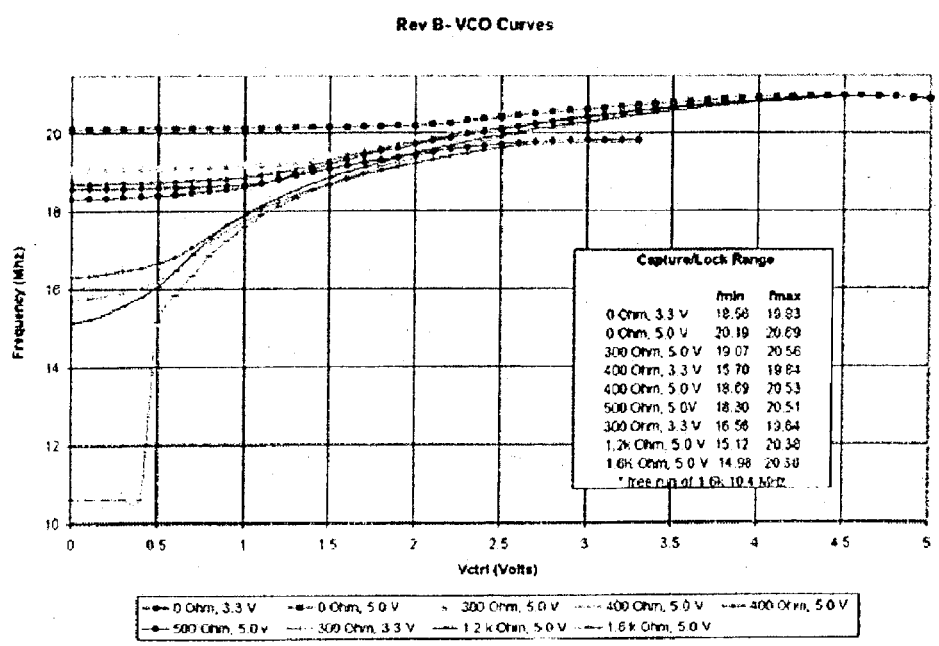
FIG. 6 shows the measured variation in VCO gain and tuning range as a function of the external (off-chip) resistor.

The gain between the variation in input voltage variation and the output voltage variation of the buffer is adjusted by means of the resistor element 46. As shown in FIG. 6, an increase in the value of the external resistor extends the tuning range of the oscillator. Furthermore, the slope of the curve increases as the value of the resistor is increased. This increase in slope results in higher gain and its attendant circuit degradation. This shows that the circuit may be manufactured and characterized with a minimal resistor selected for the final circuit application. The selected resistor is made as small as possible while still allowing for the oscillator to produce the desired output frequency range. In FIG. 6, effect of the resistor is shown for a range of 0 to 1.6 Kohms.

We claim:

1. A voltage controlled oscillator circuit, comprising:
   a voltage controlled oscillator core for generating an output signal whose frequency varies as a function of an applied control voltage;
   an input terminal for receiving said control voltage;
   a variable gain circuit between said input terminal and said voltage controlled oscillator core; and
   a control element for adjusting the gain of said variable gain circuit so as to adjust the gain applied to said control voltage.

2. The voltage controlled oscillator circuit of claim 1, wherein said variable gain circuit includes an adjustable impedance that determines the gain of said variable gain circuit.

3. The voltage controlled oscillator circuit of claim 2, wherein said variable gain circuit includes an integrated portion and an external resistor element providing said adjustable impedance.

4. The voltage controlled oscillator circuit of claim 3, wherein said integrated portion of said variable gain circuit is connected to a device pad on a monolithic integrated circuit for connection through said external resistor element to said power supply.

5. The voltage controlled oscillator circuit of claim 2, wherein said adjustable impedance includes a plurality N of resistors of fixed value, each being selectable by a selection transistor.

6. The voltage controlled oscillator circuit of claim 5, wherein said selection transistors are arranged in series with respective said selection transistors.

7. The voltage controlled oscillator circuit of claim 2, wherein said adjustable impedance includes a MOS transistor with a gate connected to an adjustable voltage source.

8. The voltage controlled oscillator circuit of claim 2, wherein said adjustable impedance includes a MOS transistor in series with a fixed resistor, said MOS transistor having a gate providing a control input for adjusting said impedance.

9. The voltage controlled oscillator circuit of claim 1, comprising a tank circuit including inductive and capacitive elements, said capacitive element including one or more varactors, and wherein said gain adjust circuit also acts as a level shifter to provide a DC offset that forward or reverse biases said varactors with respect to quiescent voltage at an oscillatory terminal thereof.

10. The voltage controlled oscillator circuit of claim 1, wherein said variable gain circuit also acts as a level shifter to provide a DC offset for said control voltage.

11. The voltage controlled oscillator circuit of claim 10, wherein said oscillator core comprises a tank circuit including inductive and capacitive elements, said capacitive element includes one or more varactors, and wherein said variable gain circuit applies said DC offset to an input terminal of said varactors.

12. A method of operating a voltage controlled oscillator, comprising:

receiving a control voltage for determining the output frequency of said voltage controlled oscillator;

passing said control voltage through a variable gain circuit prior to applying said control voltage to said voltage controlled oscillator; and adjusting the gain of said variable gain circuit to set the desired output frequency range for said voltage controlled oscillator.

13. The method of claim 12, wherein said gain is adjusted by means of an adjustable impedance, and wherein the minimum impedance is selected that is compatible with the desired output frequency range.

14. The method of claim 13, wherein said adjustable impedance is located off chip.

15. The method of claim 12, wherein said variable gain circuit also provides a DC offset to reverse or forward bias said voltage controlled oscillator so as to enhance its operating range.

* * * * *